United States Patent
Shinoda

(10) Patent No.: US 9,625,837 B2
(45) Date of Patent: Apr. 18, 2017

(54) IMPRINT APPARATUS AND METHOD OF MANUFACTURING ARTICLE

(71) Applicant: CANON KABUSHIKI KAISHA, Tokyo (JP)

(72) Inventor: Ken-ichiro Shinoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 149 days.

(21) Appl. No.: 14/326,662

(22) Filed: Jul. 9, 2014

(65) Prior Publication Data
US 2015/0014892 A1    Jan. 15, 2015

(30) Foreign Application Priority Data
Jul. 11, 2013   (JP) .................................. 2013-145841

(51) Int. Cl.
G03F 9/00      (2006.01)
G03F 7/00      (2006.01)

(52) U.S. Cl.
CPC .......... *G03F 9/7065* (2013.01); *G03F 7/0002* (2013.01); *G03F 9/7038* (2013.01); *G03F 9/7069* (2013.01); *G03F 9/7088* (2013.01)

(58) Field of Classification Search
None
See application file for complete search history.

(56) References Cited

U.S. PATENT DOCUMENTS

| 2005/0212156 A1 | 9/2005 | Tokita et al. |
| 2009/0108483 A1* | 4/2009 | Suehira ................. B82Y 10/00 264/40.5 |
| 2010/0289190 A1 | 11/2010 | Kawakami et al. |

(Continued)

FOREIGN PATENT DOCUMENTS

| JP | 5361279 A | 6/1978 |
| JP | 375529 U | 7/1991 |
| JP | 09-119811 A | 5/1997 |

(Continued)

OTHER PUBLICATIONS

Office Action issued in TW103123636, mailed Dec. 28, 2015. English translation provided.

(Continued)

*Primary Examiner* — Benjamin Schiffman
(74) *Attorney, Agent, or Firm* — Rossi, Kimms & McDowell LLP

(57) ABSTRACT

The present invention provides an imprint apparatus which forms a pattern on an imprint material on a substrate by using a mold, including a first optical member interposed between an illumination optical system and a detection optical system, and a mold, and configured to guide a first light from the illumination optical system and a second light from the detection optical system to the mold, and a second optical member interposed between the first optical member and the detection optical system, and configured to transmit the second light which is reflected by a mark formed on the mold or a mark formed on the substrate and travels toward the detection optical system through the first optical member, and block the first light which travels toward the detection optical system through the first optical member.

15 Claims, 12 Drawing Sheets

(56) References Cited

U.S. PATENT DOCUMENTS

2012/0292801 A1  11/2012  Maeda et al.

FOREIGN PATENT DOCUMENTS

| JP | 2005-286062 A | 10/2005 |
| JP | 2007-081070 A | 3/2007 |
| JP | 4791597 B2 | 10/2011 |
| JP | 2012-243863 A | 12/2012 |
| TW | 201250779 A1 | 12/2012 |
| WO | 2009/014655 A1 | 1/2009 |

OTHER PUBLICATIONS

Japanese Office Action issued in counterpart application No. JP2013145841, dated Oct. 30, 2015.

* cited by examiner

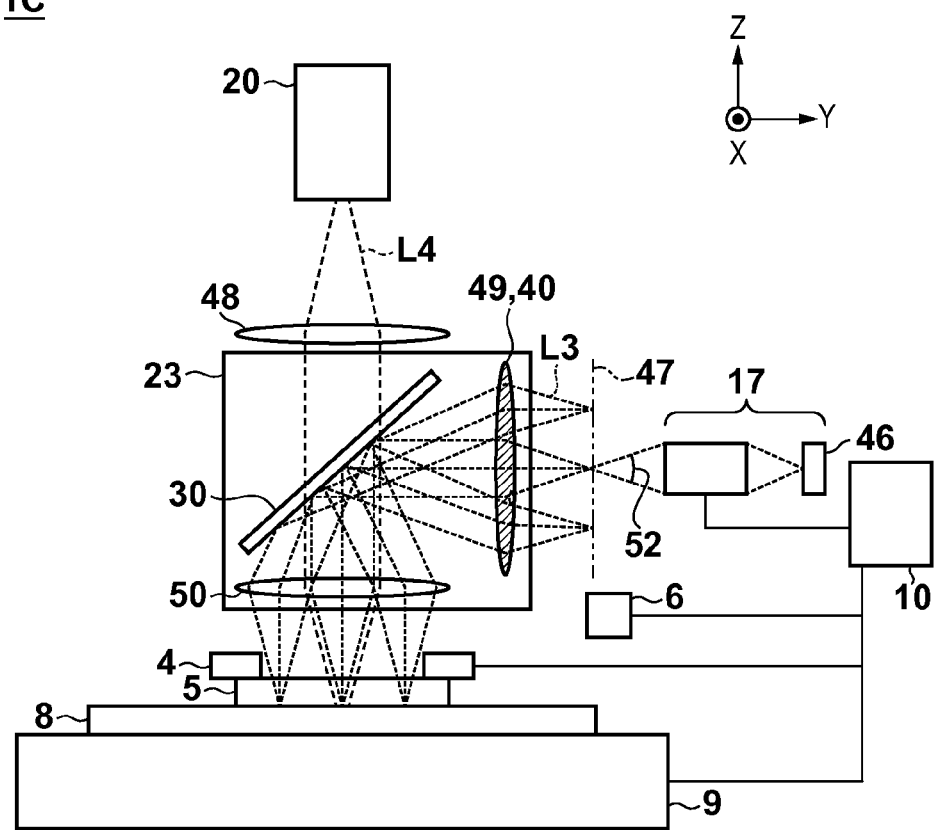
F I G. 10

F I G. 16
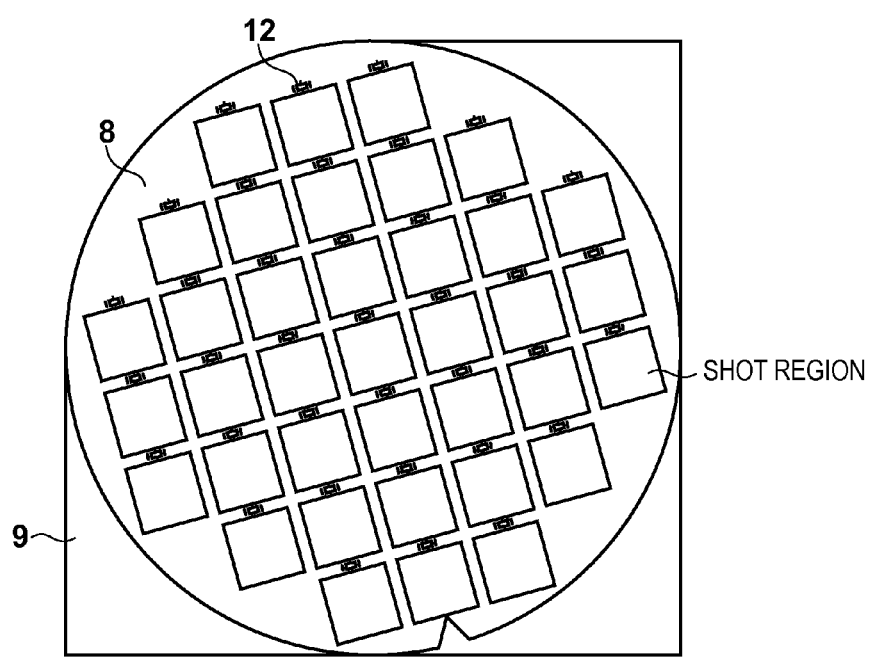

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

Recently, as micropatterning of semiconductor devices is requested more and more, an imprint technique of transferring a micropattern (three-dimensional structure) formed on a mold has been disclosed in Japanese Patent Laid-Open No. 2005-286062 and Japanese Patent No. 4791597 and has received attention.

A case in which the imprint technique is applied to a semiconductor manufacturing technique will be explained. First, an uncured photo-curing resin is supplied onto a substrate (wafer). Then, the resin on the substrate, and a mold having a three-dimensional microstructure are brought into contact with each other (imprint). The resin is irradiated with light (ultraviolet light) and cured. As a result, the three-dimensional structure of the mold is transferred to the resin on the substrate. Etching is performed by using this resin as a mask, thereby transferring the three-dimensional structure to the substrate.

In an imprint apparatus using the imprint technique, the mold and substrate physically contact each other via the resin. When the mold is imprinted or released, a force is applied to the substrate to shift the substrate from a predetermined position (alignment position). If an imprint process is performed in the next shot region while the substrate shifts, a pattern cannot be overlaid accurately at an alignment position, decreasing the device yield.

To solve this, so-called die-by-die alignment is employed, in which before bringing a mold and resin into contact with each other, alignment of a substrate is performed for each shot region and then the mold is imprinted in a state in which misalignment of the substrate is canceled. In this alignment, a through-the-mold detection system (TTM detection system) is used to detect the mark of a mold and that of a substrate. In the imprint apparatus, an illumination optical system for irradiating a resin with ultraviolet light through the mold is arranged above the mold. The TTM detection system needs to be arranged not to interfere with the illumination optical system.

However, a head which holds the mold, a head driving cable, and the like are also arranged above the mold, that is, near the illumination optical system. Thus, the space where the TTM detection system is arranged is restricted. More specifically, the TTM detection system needs to be arranged not to interfere with the illumination optical system and ultraviolet light from the illumination optical system. The TTM detection system needs be arranged with a tilt from the optical axis of the illumination optical system. At this time, the TTM detection system has a Littrow configuration, and detects the mark of a substrate by receiving light diffracted at a Littrow angle on the substrate. In the TTM detection system having the Littrow configuration, a sufficiently large numerical aperture (NA) of the TTM detection system cannot be set owing to the configuration restriction, and light irradiating a substrate is limited to a range where the condition of the Littrow configuration is satisfied. It is therefore difficult for the TTM detection system to detect the mark of a substrate and that of a mold at satisfactory accuracy, and the alignment accuracy decreases.

SUMMARY OF THE INVENTION

The present invention provides an imprint apparatus advantageous in, for example, alignment between a mold and a substrate.

According to one aspect of the present invention, there is provided an imprint apparatus which forms a pattern on an imprint material on a substrate by using a mold, including an illumination optical system configured to irradiate the imprint material with first light for curing the imprint material, a detection optical system configured to irradiate, with second light, at least one mark out of a mark formed on the mold and a mark formed on the substrate, and detect the second light reflected by the at least one mark, a first optical member interposed between the illumination optical system and the detection optical system, and the mold, and configured to guide the first light from the illumination optical system and the second light from the detection optical system to the mold, and a second optical member interposed between the first optical member and the detection optical system, and configured to transmit the second light which is reflected by the at least one mark and travels toward the detection optical system through the first optical member, and block the first light which travels toward the detection optical system through the first optical member.

Further aspects of the present invention will become apparent from the following description of exemplary embodiments with reference to the attached drawings.

BRIEF DESCRIPTION OF THE DRAWINGS

FIG. 10 is a schematic view showing the arrangement of the imprint apparatus in the sixth embodiment of the present invention.

FIG. 16 is a view showing misalignment of a substrate with respect to a substrate stage.

DESCRIPTION OF THE EMBODIMENTS

Figure 1:
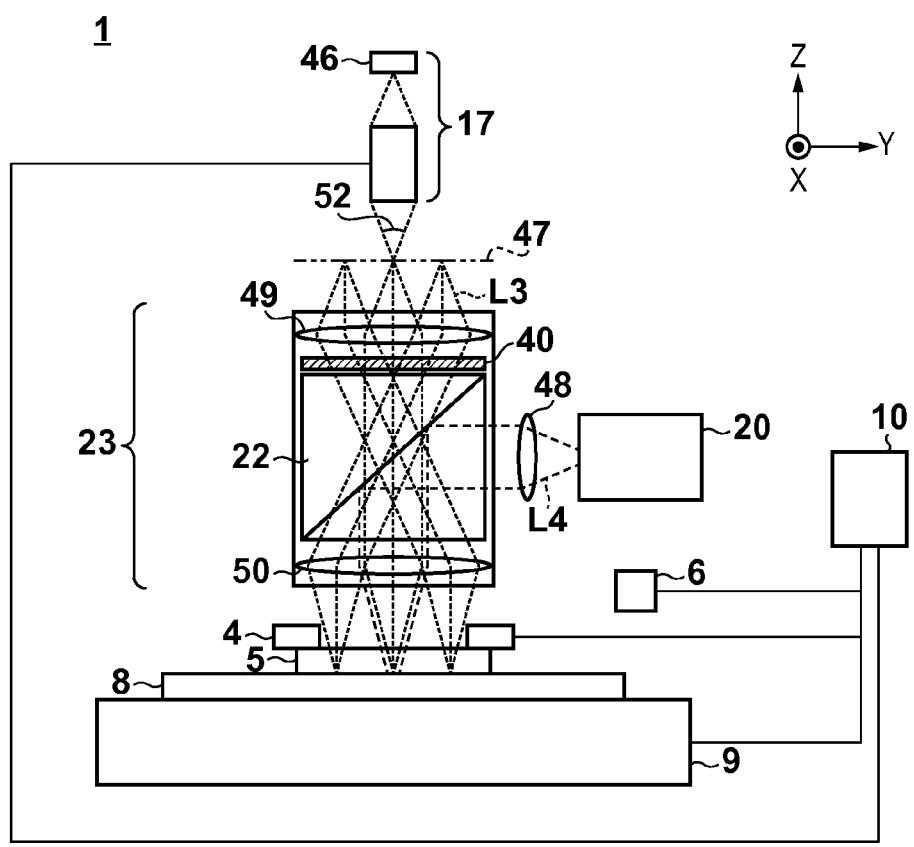
FIG. 1 is a schematic view showing the arrangement of an imprint apparatus in the first embodiment of the present invention.

Preferred embodiments of the present invention will be described below with reference to the accompanying drawings. Note that the same reference numerals denote the same members throughout the drawings, and a repetitive description thereof will not be given.

Figure 15:
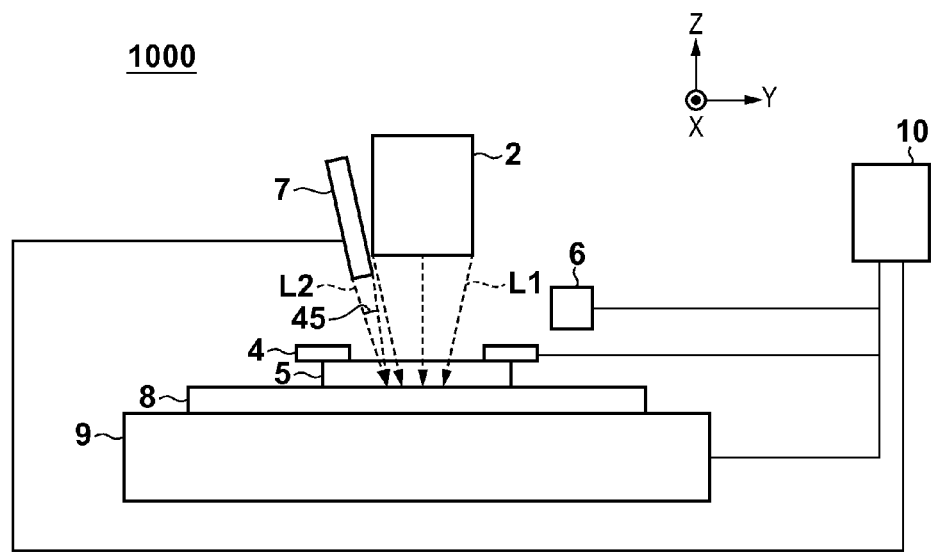
FIG. 15 is a schematic view showing the arrangement of a conventional imprint apparatus.

FIG. 15 is a schematic view showing the arrangement of a conventional imprint apparatus 1000. The imprint apparatus 1000 is a lithography apparatus which molds a resin (imprint material) on a substrate by using a mold and cures the resin to transfer a pattern onto the substrate. The imprint apparatus 1000 includes an illumination optical system 2 which emits light for curing a resin, for example, light in the ultraviolet band, a substrate stage 9 which holds a substrate 8, and a head 4 which holds a mold 5. Also, the imprint apparatus 1000 includes a through-the-mold (TTM) detection system 7, a resin coating mechanism 6, and a control unit 10 which controls the overall (operation of the) imprint apparatus 1000.

The TTM detection system 7 is a detection optical system which includes a light source and a photoelectric conversion element (for example, CCD), and detects at least one of an alignment mark (mold-side mark) formed on the mold 5 and an alignment mark (substrate-side mark) formed on the substrate 8. The TTM detection system 7 irradiates the mold-side mark and substrate-side mark with light L2, for example, light L2 in the visible band or infrared band, and detects an image formed by the light L2 reflected by the mold-side mark or an image formed by the light L2 reflected by the substrate-side mark.

The result of detection by the TTM detection system 7 is used in alignment between the mold 5 and the substrate 8. By making the positions and focuses of the mold-side mark and substrate-side mark coincide with each other, the relative positions (X, Y, and Z) of the mold 5 and substrate 8 can be made to coincide with each other. More specifically, the result of detection by the TTM detection system 7 is output to the control unit 10. Based on this detection result, the control unit 10 drives the head 4 and substrate stage 9 and can adjust (control) the positions of the mold 5 and substrate 8.

In position detection of the mold 5 and substrate 8 by the TTM detection system 7, when a multilayered film is applied or formed on the alignment mark, an interference fringe is generated upon irradiation with monochromatic light, and the alignment mark cannot be detected at high accuracy. When a resin (resist layer) is applied or formed on the alignment mark, the resin is exposed to light upon irradiation with light in the ultraviolet band. In general, an alignment system such as the TTM detection system 7 reduces (prevents) generation of an interference fringe by using wideband light having a wavelength different from that of light for curing the resin.

The operation (imprint process) of the imprint apparatus 1000 will be explained. First, the resin coating mechanism 6 applies (supplies) a resin onto the substrate 8. Then, the substrate stage 9 is moved to position the resin-applied substrate 8 below the mold 5. After the substrate 8 is positioned below the mold 5, the head 4 is moved to press the mold 5 against the resin on the substrate 8 (bring it into contact). While the mold 5 remains pressed against the resin, the resin is irradiated through the mold 5 with light L1 from the illumination optical system 2. After the resin is cured, the head 4 is moved to separate the mold 5 from the resin. By this imprint process, the pattern of the mold 5 is transferred to the resin on the substrate 8, and a micropattern (device pattern) can be formed on the substrate.

In this manner, the imprint apparatus 1000 forms a micropattern in one shot region of the substrate 8 by irradiating the resin with the light L1 from the illumination optical system 2 and curing it while keeping the mold 5 imprinted on the resin on the substrate 8. After the micropattern is formed in one shot region, the mold 5 is separated (released) from the resin on the substrate 8. The substrate stage 9 is moved to shift to the imprint process in the next shot region. By repeating the imprint process in each shot region of the substrate 8, micropatterns can be formed in all shot regions.

In the imprint process, a force arising from imprinting or release of the mold 5 is added to the substrate 8, and the position of the substrate 8 may shift with respect to the substrate stage 9, as shown in FIG. 16. If the imprint process is performed in this state, an underlying pattern and the pattern of the mold 5 cannot be overlaid accurately, decreasing the device yield.

To prevent this, die-by-die alignment is necessary. More specifically, before imprinting the mold 5 in each shot region of the substrate 8, an alignment mark (substrate-side mark) 12 formed in the shot region is detected, and the misalignment of the substrate 8 is corrected based on the detection result. The influence of misalignment of the substrate 8 arising from imprinting and release of the mold 5 can be reduced by detecting the alignment mark for each shot region and correcting the misalignment of the substrate 8. Hence, the underlying pattern and the pattern of the mold 5 can be overlaid accurately.

In the imprint apparatus 1000, a numerical aperture (NA) 45 of the TTM detection system 7 depends on the size of the TTM detection system itself. However, the TTM detection system 7 arranged not to interfere with the illumination optical system 2 and light from the illumination optical system 2 cannot be upsized, and thus the NA 45 cannot be increased. Unless the NA 45 of the TTM detection system 7 can be increased sufficiently, the light amount (that is, the amount of light detected by the TTM detection system 7) in alignment becomes small, decreasing the alignment accuracy.

When the TTM detection system 7 is arranged with a tilt from the optical axis of the illumination optical system 2, the wavelength of the light L2 irradiating the alignment mark is limited to a limited wavelength band. More specifically, the wavelength of the light L2 irradiating the alignment mark is limited to a wavelength band where the condition of a Littrow configuration corresponding to the inclination angle of the TTM detection system 7, the NA 45 of the TTM detection system 7, and the pitch of the alignment mark is satisfied. As described above, the alignment system such as the TTM detection system 7 generally uses light of a wide wavelength band as light irradiating an alignment mark. This is because the alignment mark is formed on a process substrate (various multilayered film structures), and even if there is an interference condition that light components weaken each other at a given wavelength, light in a wide wavelength band ensures a certain light amount in another wavelength band to guarantee the robustness of alignment.

In the imprint apparatus 1000, however, the wavelength band of the light L2 irradiating the alignment mark is limited to the condition of the Littrow configuration. When a multilayered film structure, having a condition such that light components weaken each other at the wavelength of the light L2, is formed on a process substrate, the amount of light in alignment decreases. If the detection accuracy of the TTM detection system 7 decreases, the misalignment of the substrate 8 cannot be corrected at high accuracy in die-by-die alignment, and the underlying pattern and the pattern of the mold 5 cannot be overlaid accurately when imprinting the mold 5.

To solve this, the present invention provides an imprint apparatus which can satisfactorily increase the NA of the TTM detection system, can use light in a wide wavelength band as light irradiating the alignment mark, and is advantageous in alignment between the mold and the substrate. Since the underlying pattern and mold pattern can be overlaid accurately, the device yield can be increased.

First Embodiment

FIG. 1 is a schematic view showing the arrangement of an imprint apparatus 1 in the first embodiment of the present invention. The imprint apparatus 1 is a lithography apparatus which molds a resin on a substrate by using a mold and cures the resin to transfer a pattern onto the substrate. Similar to the imprint apparatus 1000, the imprint apparatus 1 includes a substrate stage 9 which holds a substrate 8, a head 4 which holds a mold 5, a resin coating mechanism 6, and a control unit 10. The imprint apparatus 1 also includes an illumination optical system 20 which emits light for curing a resin on the substrate 8, for example, light (first light) L4 in the ultraviolet band, a through-the-mold (TTM) detection system 17, and a relay optical system 23.

The TTM detection system 17 includes a light source, and a sensor 46 such as a photoelectric conversion element (for example, CCD). The TTM detection system 17 is a detection optical system which detects at least one of an alignment mark (mold-side mark) formed on the mold 5 and an alignment mark (substrate-side mark) formed on the substrate 8. The TTM detection system 17 irradiates the mold-side mark and substrate-side mark with light (second light) L3, for example, light L3 in the visible band or infrared band, and detects an image formed by the light L3 reflected by the mold-side mark or an image formed by the light L3 reflected by the substrate-side mark.

The relay optical system 23 is arranged above the mold 5 (head 4). The relay optical system 23 combines the light L3 from the TTM detection system 17 and the light L4 from the illumination optical system 20, and makes them enter the substrate 8 perpendicularly. The relay optical system 23 guides the light L3 from the TTM detection system 17 and the light L4 from the illumination optical system 20 to the mold 5. The relay optical system 23 has a function of imaging a wafer plane (plane on which the substrate 8 is arranged) on an optically conjugate plane (imaging plane of the wafer plane) 47. The relay optical system 23 may be an equal-magnification system or enlargement system as long as it has a function of imaging a wafer plane. In the embodiment, the relay optical system 23 includes a beam splitter 22, a wavelength selection unit 40, and lenses 49 and 50.

The beam splitter 22 is an optical member (first optical member) which is interposed between the illumination optical system 20 and the TTM detection system 17 and guides, to the mold 5, the light L4 from the illumination optical system 20 and the light L3 from the TTM detection system 17. In other words, the beam splitter 22 has a function of combining the light L4 and light L3 having different wavelengths.

In the imprint apparatus, a head which holds the mold, a driving cable for driving the head, and the like are generally arranged above the mold, so the arrangement is very dense (there is no margin of the space).

In the imprint apparatus 1, the TTM detection system 17 is arranged in a sufficiently large space by forming the imaging plane 47 by the relay optical system 23. Since the TTM detection system 17 can be constructed by a large-size detection optical system, the numerical aperture (NA) of the TTM detection system 17 can be increased satisfactorily. In FIG. 1, the relay optical system 23 is interposed between the TTM detection system 17 and the mold 5. The TTM detection system 17 irradiates the mold 5 (mold-side mark) and the substrate 8 (substrate-side mark) with the light L3 through the relay optical system 23, and detects a misalignment between the mold 5 and the substrate 8.

The light L3 from the TTM detection system 17 passes through the lens 49, wavelength selection unit 40, beam splitter 22, and lens 50 constituting the relay optical system 23, and irradiates the mold 5 and substrate 8. The sensor 46 of the TTM detection system 17 detects the light L3 reflected by the mold 5 and substrate 8. Based on the detection result, alignment between the mold 5 and the substrate 8 is performed.

An NA 52 of the TTM detection system 17 of the imprint apparatus 1 is much larger than the NA 45 of the TTM detection system 7 of the imprint apparatus 1000. By increasing the NA of the TTM detection system 17, a satisfactory light amount (amount of light detected by the sensor 46 of the TTM detection system 17) can be ensured in alignment, implementing high-accuracy die-by-die alignment.

Similar to the TTM detection system 17, the illumination optical system 20 does not interfere with a position above the mold 5 and is arranged in a sufficiently large space. The light L4 from the illumination optical system 20 passes through a lens 48, enters the beam splitter 22, and is reflected by the beam splitter 22. The light L4 reflected by the beam splitter 22 passes through the lens 50, and reaches the substrate 8 through the mold 5.

In this manner, according to the embodiment, the beam splitter 22, that is, the relay optical system 23 including the beam splitter 22 is arranged above the mold 5. This makes it possible to arrange both the TTM detection system 17 and illumination optical system 20 in sufficiently large spaces.

In FIG. 1, refraction of a beam inside the beam splitter 22 is not illustrated. In practice, beams other than a beam perpendicularly entering the beam splitter 22, that is, a beam on the axis of the relay optical system 23 slightly shift when passing through the beam splitter 22.

Figure 2:
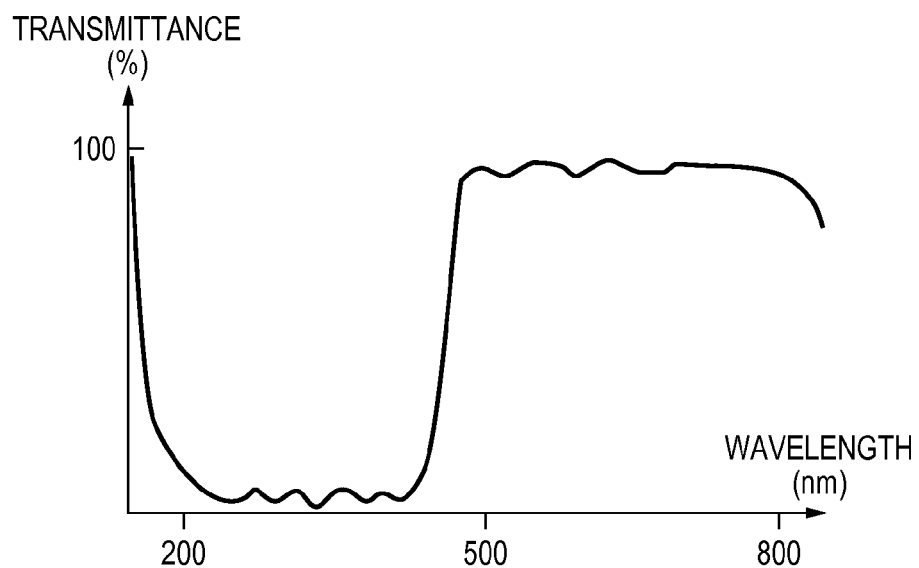
FIG. 2 is a graph showing an example of the transmittance characteristic of the beam splitter of the imprint apparatus shown in FIG. 1.

FIG. 2 is a graph showing an example of the transmittance characteristic of the beam splitter 22. In FIG. 2, the ordinate represents the transmittance [%], and the abscissa represents the wavelength [nm]. The TTM detection system 17 uses, as the light L3, light of a wide wavelength range (for example, 500 nm to 800 nm) in the visible band to the infrared band. The beam splitter 22 has a high transmittance with respect to light in the visible band to the infrared band, and a low transmittance with respect to light in the ultraviolet band, as shown in FIG. 2. Since it is difficult to zero the transmittance with respect to light in the ultraviolet band, the transmittance of the beam splitter 22 with respect to light in the ultraviolet band becomes about several %. Most of the light L4 from the illumination optical system 20 is reflected by the beam splitter 22, part of it is reflected by the mold 5 or substrate 8, and then most of it is reflected again by the beam splitter 22 (that is, returns to the illumination optical system 20). However, part of the light L4 passes through the beam splitter 22 and reaches the TTM detection system 17 (sensor 46). If part of the light L4 from the illumination optical system 20 reaches the TTM detection system 17, it becomes noise of light detected by the sensor 46, decreasing the alignment accuracy.

Optical members (for example, the lens 49, and optical members constituting the optical system of the TTM detection system 17) inserted in an optical path extending from the beam splitter 22 to the sensor 46 are designed and manufactured to implement predetermined performance with respect to the wavelength (wavelength in the visible band to the infrared band) of the light L3. These optical members do not always have sufficient durability to light in the ultraviolet band (light having high photon energy). If these optical members are irradiated with light in the ultraviolet band, that is, the light L4 from the illumination optical system 20, the performance may degrade. Note that the above-mentioned optical members include a glass material, optical films (for example, an antireflection film and reflection film), and an adhesive for bonding glass materials.

In the embodiment, the wavelength selection unit 40 is arranged in the subsequent stage of the beam splitter 22 so that the light L4 from the illumination optical system 20 does not irradiate (reach) the optical members inserted in the optical path extending from the beam splitter 22 to the sensor 46. The wavelength selection unit 40 is interposed between the beam splitter 22 and the TTM detection system 17, and in the embodiment, between the beam splitter 22 and the lens 49.

The wavelength selection unit 40 has a function of transmitting the light L3 which is reflected by the alignment mark and travels toward the TTM detection system 17 through the beam splitter 22, and blocking the light L4 which is reflected by the substrate 8 and travels toward the TTM detection system 17 through the beam splitter 22. The wavelength selection unit. 40 is an optical member (second optical member) which reflects light in the ultraviolet band (light L4 from the illumination optical system 20), and transmits light in the visible band to the infrared band (light L3 from the TTM detection system 17). The wavelength selection unit 40 may absorb light in the ultraviolet band, and transmit light in the visible band to the infrared band. More specifically, the wavelength selection unit 40 is constructed by a reflecting member which reflects the light L4 traveling toward the TTM detection system 17, or an absorbing member which absorbs light traveling toward the TTM detection system 17.

Figure 3:
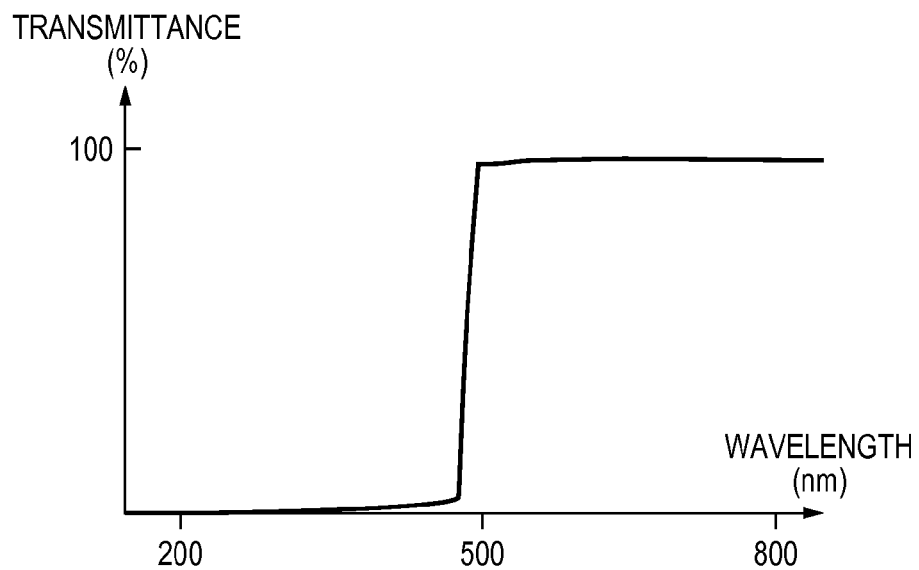
FIG. 3 is a graph showing an example of the transmittance characteristic of the wavelength selection unit of the imprint apparatus shown in FIG. 1.

FIG. 3 is a graph showing an example of the transmittance characteristic of the wavelength selection unit 40. In FIG. 3, the ordinate represents the transmittance [%], and the abscissa represents the wavelength [nm]. The wavelength selection unit 40 has a characteristic of cutting light in the ultraviolet band (unnecessary light L4) to be 1% or less, and transmitting light in the visible band to the infrared band (necessary light L3), as shown in FIG. 3.

By interposing the wavelength selection unit 40 between the beam splitter 22 and the TTM detection system 17, the light L4 from the illumination optical system 20 can be prevented from reaching the TTM detection system 17 (sensor 46). In alignment, the sensor 46 can detect only the light L3 reflected by the alignment mark (that is, without containing noise generated by the light L4), so high-accuracy die-by-die alignment can be implemented. Also, degradation of the performance of the optical members which are not durable to ultraviolet light, that is, the optical members inserted in the optical path extending from the beam splitter 22 to the sensor 46 can be prevented. Therefore, high-accuracy die-by-die alignment can be maintained for a long period.

The imprint apparatus 1 according to the embodiment can correct, at high accuracy, misalignment of the substrate 8 that occurs when the mold 5 is imprinted or released. The imprint apparatus 1 can overlay the pattern of the mold 5 on the underlying pattern at high accuracy. Note that the misalignment of the substrate 8 is corrected by controlling, by the control unit 10, the relative positions of the mold 5 and substrate 8 based on (the image (first image) of) the mold-side mark and (the image (second image) of) the substrate-side mark which have been detected by the TTM detection system 17.

In FIG. 1, the wavelength selection unit 40 is interposed between the lens 49 and the beam splitter 22, as described above. However, when the lens 49 is durable to light from the illumination optical system 20 (that is, the lens 49 has the same configuration as that of the lens 50), the wavelength selection unit 40 may be interposed between the lens 49 and the TTM detection system 17.

Second Embodiment

Figure 4:
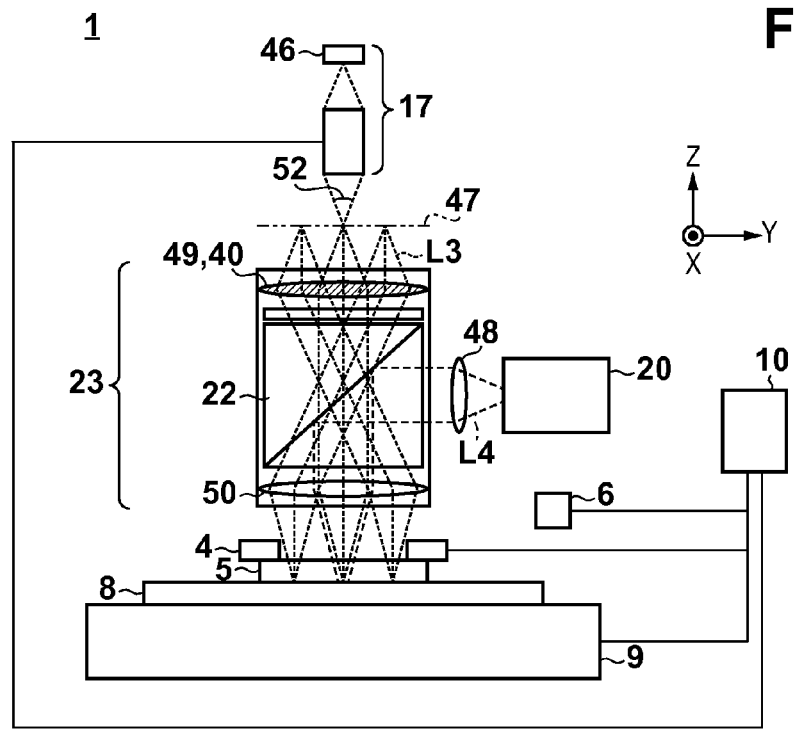
FIG. 4 is a schematic view showing the arrangement of an imprint apparatus in the second embodiment of the present invention.

FIG. 4 is a schematic view showing the arrangement of an imprint apparatus 1 in the second embodiment of the present invention. A lens 49 may have the function of a wavelength selection unit 40. In FIG. 4, an optical film which reflects light in the ultraviolet band (light L4 from an illumination optical system 20) and transmits light in the visible band to the infrared band (light L3 from a TTM detection system 17), or an optical film which absorbs light in the ultraviolet band and transmits light in the visible band to the infrared band is formed on the lens 49. This gives the function of the wavelength selection unit 40 to the lens 49. The lens 49 may be made of a material which reflects light in the ultraviolet band and transmits light in the visible band to the infrared band, or a material which absorbs light in the ultraviolet band and transmits light in the visible band to the infrared band.

Third Embodiment

Figure 5:
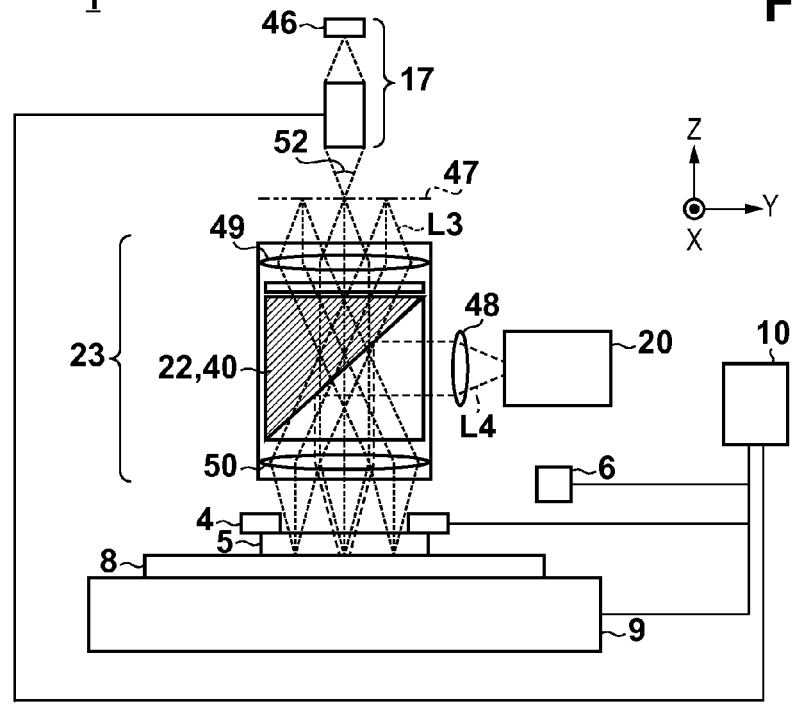
FIG. 5 is a schematic view showing the arrangement of an imprint apparatus in the third embodiment of the present invention.

FIG. 5 is a schematic view showing the arrangement of an imprint apparatus 1 in the third embodiment of the present invention. A beam splitter 22 may have the function of a wavelength selection unit 40. In FIG. 5, out of two prisms constituting the beam splitter 22, a prism closer to a TTM detection system 17 has the function of the wavelength selection unit 40. More specifically, the prism closer to the TTM detection system 17 is made of a material which reflects light in the ultraviolet band and transmits light in the visible band to the infrared band, or a material which absorbs light in the ultraviolet band and transmits light in the visible band to the infrared band. An optical film which reflects light in the ultraviolet band and transmits light in the visible band to the infrared band, or an optical film which absorbs light in the ultraviolet band and transmits light in the visible band to the infrared band may be formed on the beam splitter 22.

Fourth Embodiment

Figure 6:
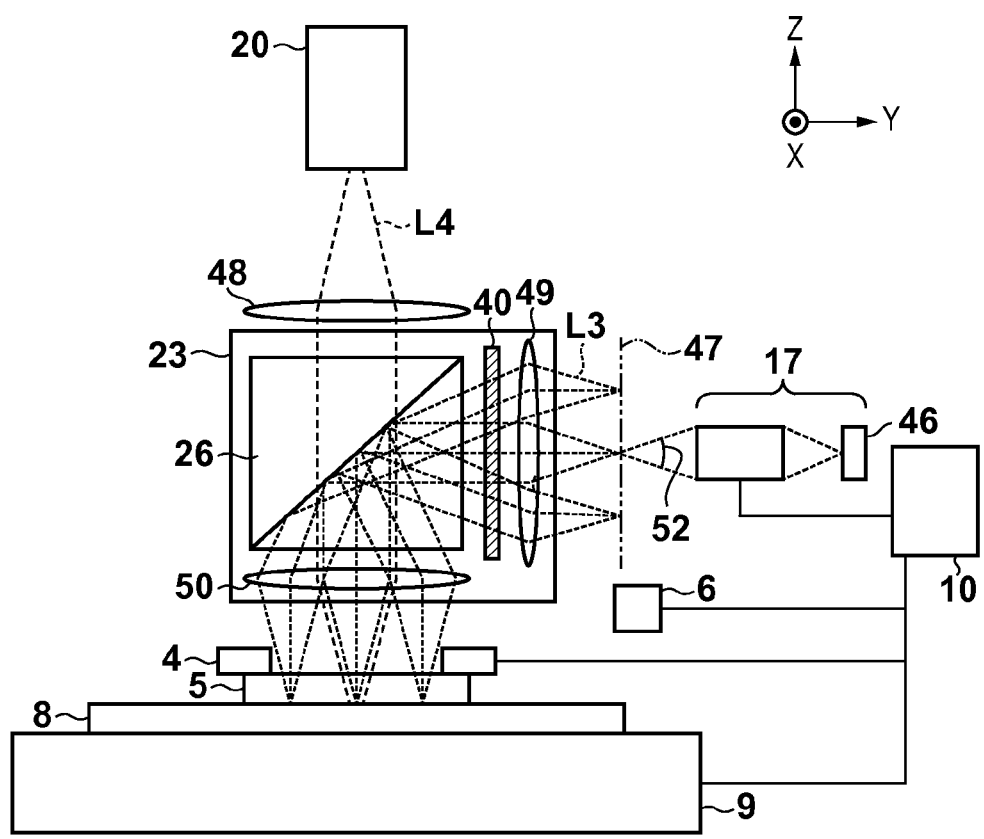
FIG. 6 is a schematic view showing the arrangement of an imprint apparatus in the fourth embodiment of the present invention.

FIG. 6 is a schematic view showing the arrangement of an imprint apparatus 1A in the fourth embodiment of the present invention. In the first, second, and third embodiments, the beam splitter has a characteristic of transmitting the light L3 from the TTM detection system 17 and reflecting the light L4 from the illumination optical system 20. This characteristic of the beam splitter may be reversed. In other words, the beam splitter suffices to have a characteristic of transmitting one of the light L3 and light L4 and reflecting the other light.

In the imprint apparatus 1A in FIG. 6, as in the imprint apparatus 1, a relay optical system 23 including a beam splitter 26 is arranged above a mold 5. The relay optical system 23 combines light L3 from a TTM detection system 17 and light L4 from an illumination optical system 20, and makes them enter a substrate 8 perpendicularly. The relay optical system 23 guides the light L3 from the TTM detection system 17 and the light L4 from the illumination optical system 20 to the mold 5. The relay optical system 23 has a function of imaging a wafer plane (plane on which the substrate 8 is arranged) on an optically conjugate plane (imaging plane of the wafer plane) 47. The relay optical system 23 may be an equal-magnification system or enlargement system as long as it has a function of imaging a wafer plane. In the embodiment, the relay optical system 23 includes the beam splitter 26, a wavelength selection unit 40, and lenses 49 and 50. Note that the characteristic of the beam splitter 26 is different from that of the beam splitter 22.

The light L3 from the TTM detection system 17 passes through the lens 49 and wavelength selection unit 40 constituting the relay optical system 23, is reflected by the beam splitter 26, passes through the lens 50, and irradiates the mold 5 and substrate 8. A sensor 46 of the TTM detection system 17 detects the light L3 reflected by the mold 5 and substrate 8. Based on the detection result, alignment between the mold 5 and the substrate 8 is performed.

An NA 52 of the TTM detection system 17 of the imprint apparatus 1A is much larger than the RA 45 of the TTM detection system 7 of the imprint apparatus 1000. By increasing the NA of the TTM detection system 17, a satisfactory light amount (amount of light detected by the sensor 46 of the TTM detection system 17) can be ensured in alignment, implementing high-accuracy die-by-die alignment.

Similar to the TTM detection system 17, the illumination optical system 20 does not interfere with a position above the mold 5 and is arranged in a sufficiently large space. The light L4 from the illumination optical system 20 passes through a lens 48, enters the beam splitter 26, and passes through it. The light L4 having passed through the beam splitter 26 passes through the lens 50, and reaches the substrate 8 through the mold 5. In this way, according to the embodiment, the beam splitter 26, that is, the relay optical system 23 including the beam splitter 26 is arranged above the mold 5. This allows arranging both the TTM detection system 17 and illumination optical system 20 in sufficiently large spaces.

Figure 7:
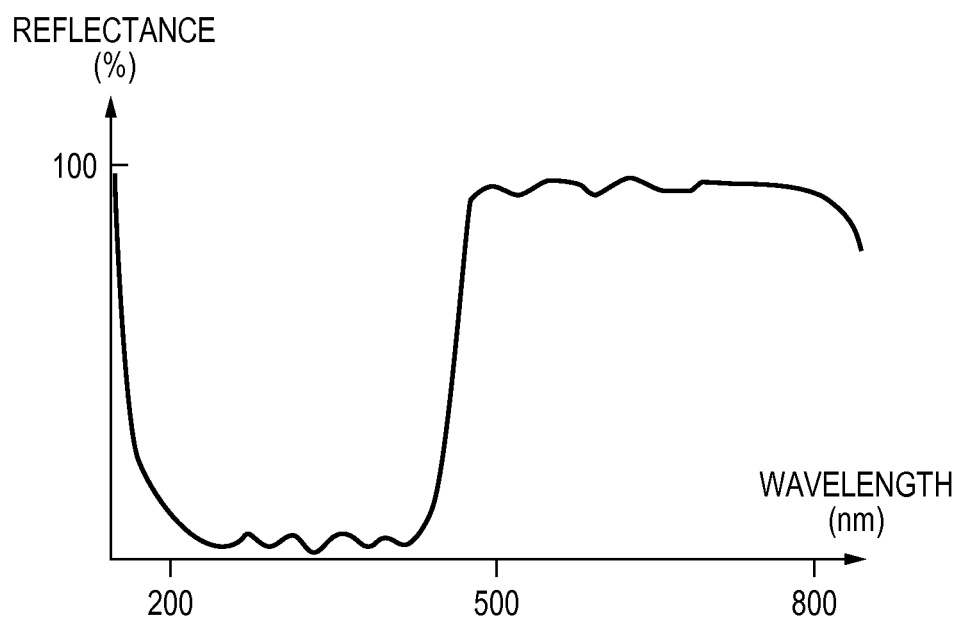
FIG. 7 is a graph showing an example of the reflectance characteristic of the beam splitter of the imprint apparatus shown in FIG. 6.

FIG. 7 is a graph showing an example of the reflectance characteristic of the beam splitter 26. In FIG. 7, the ordinate represents the reflectance [%], and the abscissa represents the wavelength [nm]. The TTM detection system 17 uses, as the light L3, light of a wide wavelength range (far example, 500 nm to 800 nm) in the visible band to the infrared band. The beam splitter 26 has a high reflectance with respect to light in the visible band to the infrared band, and a low reflectance with respect to light in the ultraviolet band, as shown in FIG. 7. Since it is difficult to zero the reflectance with respect to light in the ultraviolet band, the reflectance of the beam splitter 26 with respect to light in the ultraviolet band becomes about several %. Most of the light L4 from the illumination optical system 20 passes through the beam splitter 26, part of it is reflected by the mold 5 or substrate 8, and then most of it passes again through the beam splitter 26 (that is, returns to the illumination optical system 20). However, part of the light L4 is reflected by the beam splitter 26 and reaches the TTM detection system 17 (sensor 46). If part of the light L4 from the illumination optical system 20 reaches the TTM detection system 17, it becomes noise of light detected by the sensor 46, decreasing the alignment accuracy.

Optical members (for example, the lens 49, and optical members constituting the optical system of the TTM detection system 17) inserted in an optical path extending from the beam splitter 26 to the sensor 46 are designed and manufactured to implement predetermined performance with respect to the wavelength (wavelength in the visible band to the infrared band) of the light L3. These optical members do not always have sufficient durability to light in the ultraviolet band (light having high photon energy). If these optical members are irradiated with light in the ultraviolet band, that is, the light L4 from the illumination optical system 20, the performance may degrade.

In the embodiment, the wavelength selection unit 40 is therefore arranged in the subsequent stage of the beam splitter 26 so that the light L4 from the illumination optical system 20 does not irradiate (reach) the optical members inserted in the optical path extending from the beam splitter 26 to the sensor 46. The wavelength selection unit 40 is interposed between the beam splitter 26 and the TTM detection system 17, and in the embodiment, between the beam splitter 26 and the lens 49.

The wavelength selection unit 40 is an optical member having a function of transmitting the light L3 which is reflected by the alignment mark and travels toward the TTM detection system 17 through the beam splitter 26, and blocking the light L4 which is reflected by the substrate 8 and travels toward the TTM detection system 17 through the beam splitter 26. For example, the wavelength selection unit 40 reflects light in the ultraviolet band (light L4 from the illumination optical system 20), and transmits light in the visible band to the infrared band (light L3 from the TTM detection system 17). The wavelength selection unit 40 may absorb light in the ultraviolet band, and transmit light in the visible band to the infrared band.

By interposing the wavelength selection unit 40 between the beam splitter 26 and the TTM detection system 17, the light L4 from the illumination optical system 20 can be prevented from reaching the TTM detection system 17 (sensor 46). In alignment, the sensor 46 can detect only the light L3 reflected by the alignment mark (that is, without containing noise generated by the light L4), so high-accuracy die-by-die alignment can be implemented. Also, degradation of the performance of the optical members which are not durable to ultraviolet light, that is, the optical members inserted in the optical path extending from the beam splitter 26 to the sensor 46 can be prevented. Therefore, high-accuracy die-by-die alignment can be maintained for a long period.

The imprint apparatus 1A according to the embodiment can correct, at high accuracy, misalignment of the substrate 8 that occurs when the mold 5 is imprinted or released. The imprint apparatus 1A can overlay the pattern of the mold 5 on the underlying pattern at high accuracy.

The lens 49 or (a prism constituting) the beam splitter 26 may have the function of the wavelength selection unit 40. More specifically, as described in the second embodiment (FIG. 4), the lens 49 is constructed using an optical film or material which reflects or absorbs the light L4 in the ultraviolet band and transmits the light L3 in the visible band to the infrared band. Similarly, as described in the third embodiment (FIG. 5), the beam splitter 26 is constructed using an optical film or material which reflects or absorbs the light L4 in the ultraviolet band and transmits the light L3 in the visible band to the infrared band.

Fifth Embodiment

Figure 8:
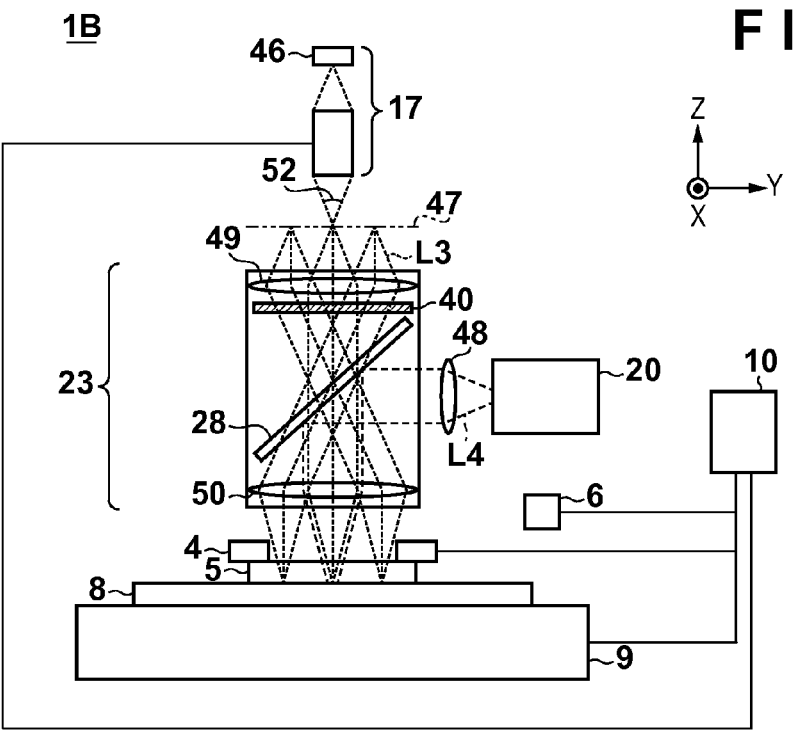
FIG. 8 is a schematic view showing the arrangement of an imprint apparatus in the fifth embodiment of the present invention.

FIG. 8 is a schematic view showing the arrangement of an imprint apparatus 1B in the fifth embodiment of the present invention. The imprint apparatuses 1 and 1A include the beam splitters 22 and 26 each constituted by prisms, respectively. However, the imprint apparatus may include a flat beam splitter 28, as in the imprint apparatus 1B shown in FIG. 8.

The flat beam splitter 28 is constituted by a flat plate on which an optical film having a transmittance characteristic as shown in FIG. 2 is formed. However, the flat beam splitter 28 can also be replaced with a so-called dichroic mirror. The characteristic of the flat beam splitter 28 may not be a perfect reflection characteristic or perfect transmission characteristic. For example, the flat beam splitter 28 may have a characteristic of reflecting 90% of light L4 from an illumination optical system 20, transmitting 10% of the light L4, transmitting 90% of light L3 from a TTM detection system 17, and reflecting 10% of the light L3. Note that the ratio of reflection and transmission on the flat beam splitter 28 is not limited to 9:1, and may be 8:2, 7:3, or the like. To prevent the light L4 reflected by the mold 5 or substrate 8 from reaching the TTM detection system 17 (sensor 46), the wavelength selection unit 40 is preferably interposed between the flat beam splitter 28 and the TTM detection system 17.

Sixth Embodiment

Figure 9:
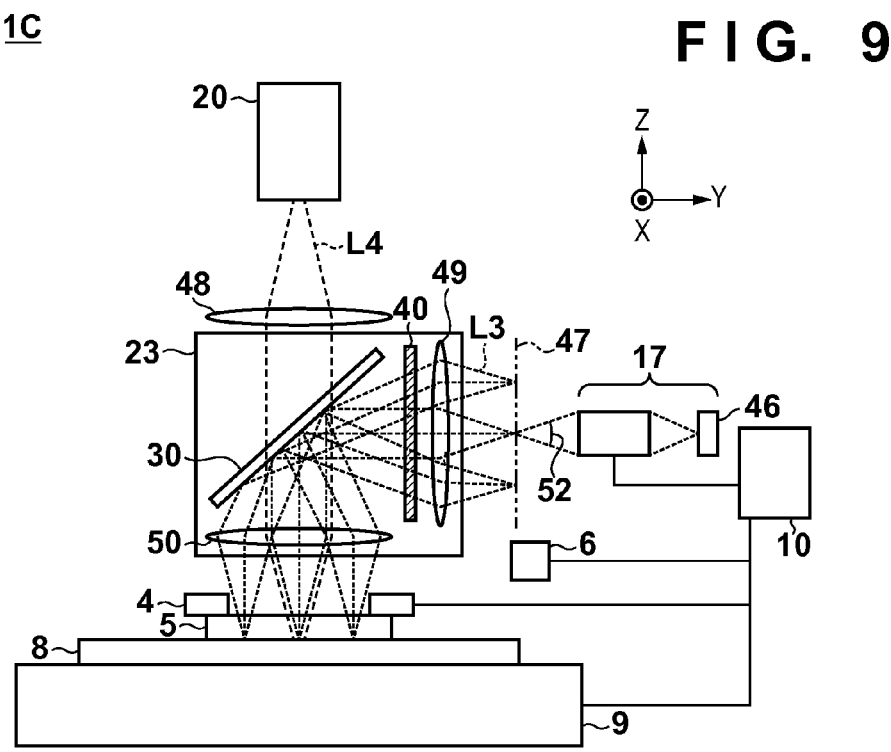
FIG. 9 is a schematic view showing the arrangement of an imprint apparatus in the sixth embodiment of the present invention.

FIG. 9 is a schematic view showing the arrangement of an imprint apparatus 1C in the sixth embodiment of the present invention. In the fifth embodiment, the flat beam splitter 28 has a characteristic of transmitting the light L3 from the TTM detection system 17 and reflecting the light L4 from the illumination optical system 20. However, this characteristic may be reversed. In the imprint apparatus 1C, as in the imprint apparatus 1B, a relay optical system 23 including a flat beam splitter 30 is arranged above a mold 5. The relay optical system 23 combines light L3 from a TTM detection system 17 and light L4 from an illumination optical system 20, and makes them enter a substrate 8 perpendicularly. The relay optical system 23 guides the light L3 from the TTM detection system 17 and the light L4 from the illumination optical system 20 to the mold 5.

The flat beam splitter 30 is constituted by a flat plate on which an optical film having a reflectance characteristic as shown in FIG. 7 is formed. However, the flat beam splitter 30 can also be replaced with a so-called dichroic mirror. The characteristic of the flat beam splitter 30 may not be a perfect reflection characteristic or perfect transmission characteristic. For example, the flat beam splitter 30 may have a characteristic of transmitting 90% of the light L4 from the illumination optical system 20, reflecting 10% of the light L4, reflecting 90% of the light L3 from the TTM detection system 17, and transmitting 10% of the light L3. Note that the ratio of reflection and transmission on the flat beam splitter 30 is not limited to 9:1, and may be 8:2, 7:3, or the like. To prevent the light L4 reflected by the mold 5 or substrate 8 from reaching the TTM detection system 17 (sensor 46), a wavelength selection unit 40 is preferably interposed between the flat beam splitter 30 and the TTM detection system 17.

As shown in FIG. 10, an optical member, for example, a lens 49 arranged in the subsequent stage of the flat beam splitter 30 may have the function of the wavelength selection unit 40. More specifically, the lens 49 is constructed using an optical film or material which reflects the light L4 in the ultraviolet band and transmits the light L3 in the visible band to the infrared band.

The above-described embodiments have exemplified a case in which the TTM detection system 17 is formed from one system. However, the TTM detection system 17 may be formed from a plurality of systems. For example, when a plurality of portions in a shot region on the substrate 8 are to be measured simultaneously in die-by-die alignment, the TTM detection system 17 is preferably formed from a plurality of systems. Even when the TTM detection system 17 is formed from one system, a plurality of portions in the shot region can be measured by moving the substrate stage 9 or TTM detection system 17. However, the substrate stage 9 or TTM detection system 17 needs to be moved, so the alignment accuracy readily drops. Since the arrangement above the mold 5 is very dense, as described above, it is difficult in arrangement to form the TTM detection system 17 from a plurality of systems. The TTM detection system 17 may detect not only the images of the mold-side mark and substrate-side mark, but also interference light between light from the mold-side mark and light from the substrate-side mark, thereby performing alignment between the mold and the substrate.

If the relay optical system 23 (for example, the beam splitter 22) is arranged above the mold 5, high alignment accuracy can be implemented. That is, even if the TTM detection system 17 with a high NA is formed from a plurality of systems, it can be arranged above the mold 5. As a result, a plurality of different portions in a single shot region on the substrate 8 can be measured simultaneously, and high-accuracy alignment can be implemented.

Seventh Embodiment

Figure 11:
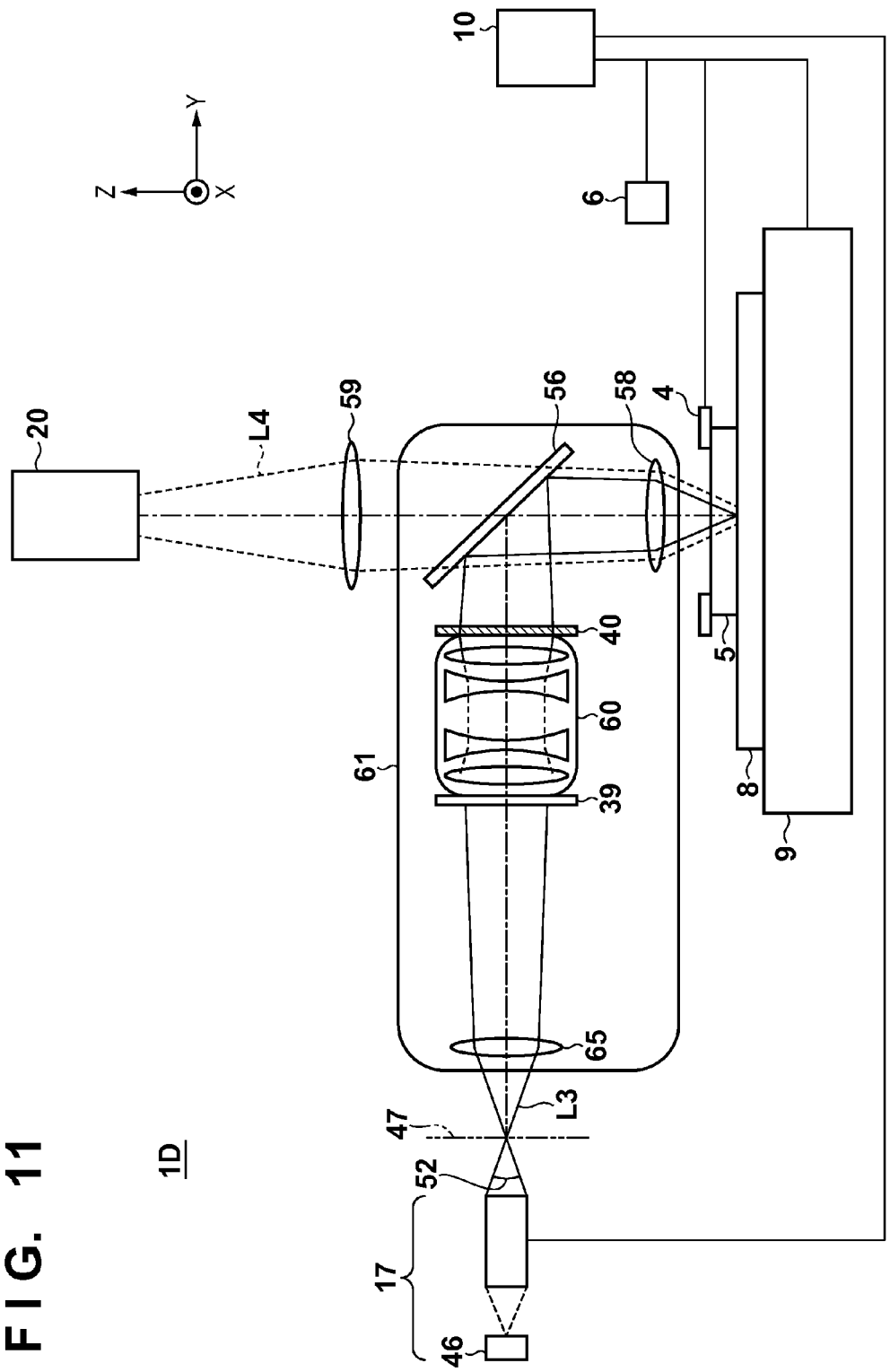
FIG. 11 is a schematic view showing the arrangement of an imprint apparatus in the seventh embodiment of the present invention.

FIG. 11 is a schematic view showing the arrangement of an imprint apparatus 1D in the seventh embodiment of the present invention. The above-described embodiments have exemplified a case in which the beam splitter is arranged in the pupil space of the relay optical system. In some cases, however, the beam splitter may not be able to be arranged in the pupil space owing to the arrangement of the relay optical system. In such a case, the beam splitter is arranged not in the pupil space of the relay optical system, but at a position near the image plane, as in the imprint apparatus 1D shown in FIG. 11.

A relay optical system 61 is arranged above a mold 5 (head 4). The relay optical system 61 combines light L3 from a TTM detection system 17 and light L4 from an illumination optical system 20, and makes them enter a substrate 8 perpendicularly. The relay optical system 23 guides the light L3 from the TTM detection system 17 and the light L4 from the illumination optical system 20 to the mold 5. The relay optical system 61 has a function of imaging a wafer plane (plane on which the substrate 8 is arranged) on an optically conjugate plane (imaging plane of the wafer plane) 47. In the embodiment, the relay optical system 61 includes a beam splitter 56, a wavelength selection unit 40, an optical system 60, a parallel flat plate 39, and lenses 58 and 65.

The beam splitter 56 is a parallel flat plate beam splitter and is arranged at a position near the image plane. The beam splitter 56 is an optical member which guides, to the mold 5, the light L4 from the illumination optical system 20 and the light L3 from the TTM detection system 17.

Optical members constituting the relay optical system 61 are arranged to be point-symmetric about the center of the optical system 60, that is, the center of the relay optical system 61 (to have an optically symmetric shape). By constructing the relay optical system 61 into a symmetric optical system, generation of coma can be prevented. The relay optical system 61 includes the parallel flat plate 39 having the same shape as that of the wavelength selection unit 40.

The optical system 60 is constituted by a combination of convex and concave lenses. The optical system 60 satisfactorily corrects chromatic aberration of the relay optical system 61 in the wavelength band (for example, the visible band to the ultraviolet band) of the light L3 from the TTM detection system 17. The convex and concave lenses may be bonded to each other, and an adhesive may be used on the bonded surface.

The light L3 from the TTM detection system 17 passes through the lens 65 and parallel flat plate 39, and reaches the optical system 60. The light L3 having passed through the optical system 60 and wavelength selection unit 40 is reflected by the beam splitter 56, passes through the lens 58, and irradiates the mold 5 and substrate 8. The sensor 46 of the TTM detection system 17 detects the light L3 reflected by the mold 5 and substrate 8. Based on the detection result, alignment between the mold 5 and the substrate 8 is performed.

To the contrary, the light L4 from the illumination optical system 20 passes through an illumination system lens 59, enters the beam splitter 56, and passes through it. The light L4 having passed through the beam splitter 56 passes through the lens 58, and reaches the substrate 8 through the mold 5.

Since the parallel flat plate beam splitter 56 is tilted and arranged at a position near the image plane, an asymmetric aberration is generated in the light L3 passing through the beam splitter 56. In the imprint apparatus, however, the imaging performance of the light L3 from the TTM detection system 17 is more important than that of the light L4 from the illumination optical system 20. Hence, when the parallel flat plate beam splitter 56 is used, it is preferable to set light reflected by the beam splitter 56 as the light L3, and light passing through the beam splitter 56 as the light L4.

The beam splitter 56 has a reflectance characteristic as shown in FIG. 7. Most of the light L4 from the illumination optical system 20 passes through the beam splitter 56, part of it is reflected by the mold 5 or substrate 8, and then most of it passes again through the beam splitter 56 (that is, returns to the illumination optical system 20). However, part of the light L4 is reflected by the beam splitter 56 and reaches the TTM detection system 17 (sensor 46). If part of the light L4 from the illumination optical system 20 reaches the TTM detection system 17, it becomes noise of light detected by the sensor 46, decreasing the alignment accuracy.

Optical members (for example, optical members constituting the optical system 60 and the optical system of the TTM detection system 17) inserted in an optical path extending from the beam splitter 56 to the sensor 46 are designed and manufactured to implement predetermined performance with respect to the wavelength (wavelength in the visible band to the infrared band) of the light L3. These optical members do not always have sufficient durability to light in the ultraviolet band (light having high photon energy). If these optical members are irradiated with light in the ultraviolet band, that is, the light L4 from the illumination optical system 20, the performance may degrade.

In the embodiment, the wavelength selection unit 40 is therefore arranged in the subsequent stage of the beam splitter 56 so that the light L4 from the illumination optical system 20 does not irradiate (reach) the optical members inserted in the optical path extending from the beam splitter 56 to the sensor 46. The wavelength selection unit 40 is interposed between the beam splitter 56 and the TTM detection system 17, and in the embodiment, between the beam splitter 56 and the optical system 60.

The wavelength selection unit 40 is an optical member having a function of transmitting the light L3 which is reflected by the alignment mark and travels toward the TTM detection system 17 through the beam splitter 56, and blocking the light L4 which is reflected by the substrate 8 and travels toward the TTM detection system 17 through the beam splitter 56. For example, the wavelength selection unit 40 reflects light in the ultraviolet band (light L4 from the illumination optical system 20), and transmits light in the visible band to the infrared band (light L3 from the TTM detection system 17). The wavelength selection unit 40 may absorb light in the ultraviolet band, and transmit light in the visible band to the infrared band.

By interposing the wavelength selection unit 40 between the beam splitter 56 and the TTM detection system 17, the light L4 from the illumination optical system 20 can be prevented from reaching the TTM detection system 17 (sensor 46). In alignment, the sensor 46 can detect only the light L3 reflected by the alignment mark (that is, without containing noise generated by the light L4), so high-accuracy die-by-die alignment can be implemented. Also, degradation of the performance of the optical members which are not durable to ultraviolet light, that is, the optical members inserted in the optical path extending from the beam splitter 56 to the sensor 46 can be prevented. Therefore, high-accuracy die-by-die alignment can be maintained for a long period.

Figure 12:
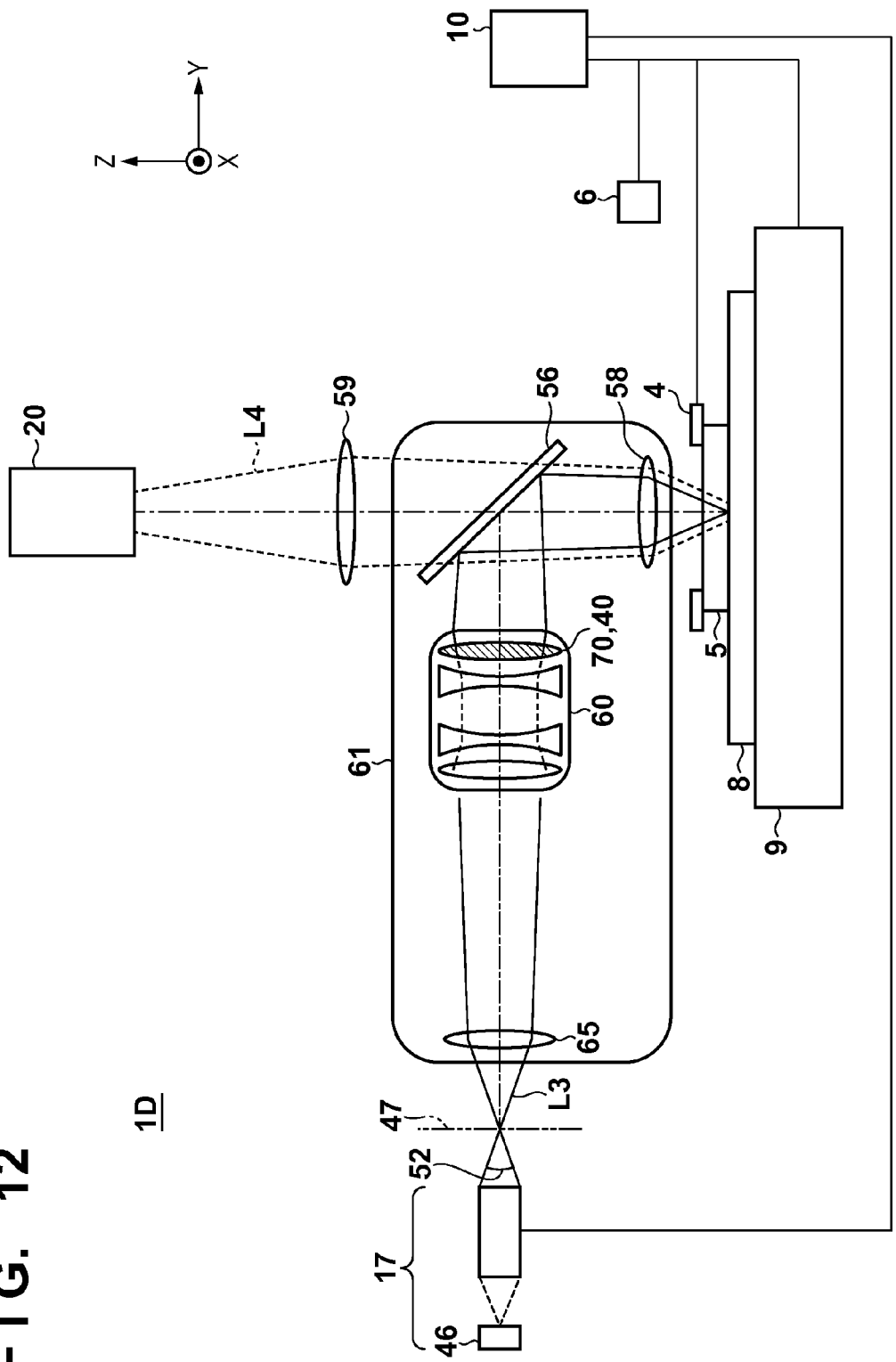
FIG. 12 is a schematic view showing the arrangement of the imprint apparatus in the seventh embodiment of the present invention.

Part of the optical system 60 may have the function of the wavelength selection unit 40. For example, as shown in FIG. 12, a lens 70 (lens closest to the beam splitter 56) constituting the optical system 60 may have the function of the wavelength selection unit 40. More specifically, the lens 70 constituting the optical system 60 is made of a material which reflects light in the ultraviolet band and transmits light in the visible band to the infrared band, or a material which absorbs light in the ultraviolet band and transmits light in the visible band to the infrared band. An optical film which reflects light in the ultraviolet band and transmits light in the visible band to the infrared band, or an optical film which absorbs light in the ultraviolet band and transmits light, in the visible band to the infrared band may be formed on the lens 70 constituting the optical system 60.

Eighth Embodiment

Figure 13:
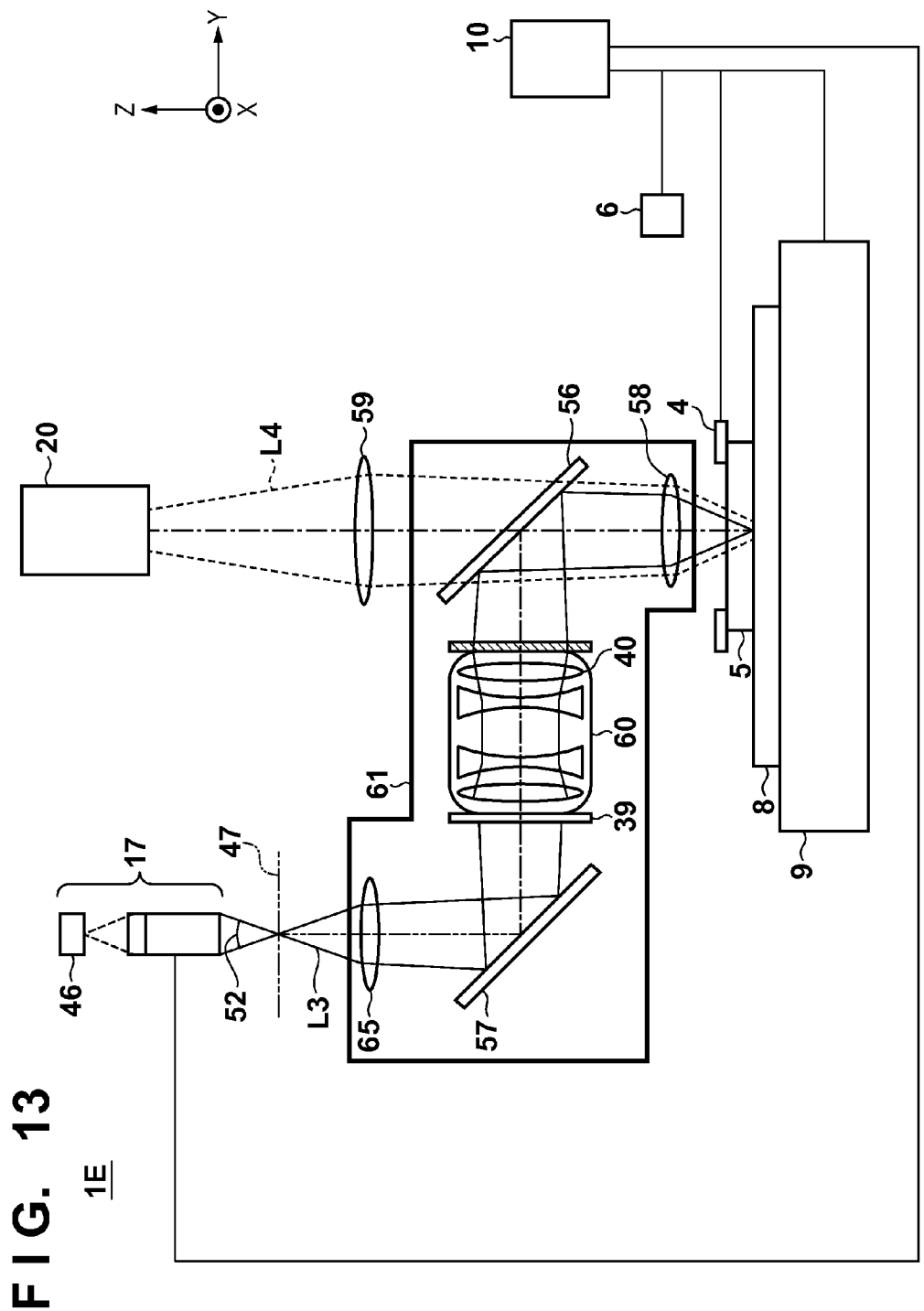
FIG. 13 is a schematic view showing the arrangement of an imprint apparatus in the eighth embodiment of the present invention.

FIG. 13 is a schematic view showing the arrangement of an imprint apparatus 1E in the eighth embodiment of the present invention. The imprint apparatus 1E is configured by adding a mirror 57 to a relay optical system 61 in the imprint apparatus 1D. The relay optical system 61 becomes point-symmetric about the center of an optical system 60, that is, the center of the relay optical system 61 in regard to not only transmitting members but also reflecting members (a beam splitter 56 and the mirror 57).

Since light L3 from a TTM detection system 17 is reflected by the beam splitter 56, the reflection characteristic (phase change amount for each reflectance or reflection angle) of the mirror 57 is preferably the same as that of the beam splitter 56. For example, by setting the reflection characteristic of the mirror 57 to be equal to that of the beam splitter 56, the mirror 57 can cancel a phase change amount generated in the beam splitter 56 for each reflection angle. Accordingly, a satisfactory imaging characteristic of the relay optical system 61 can be maintained. If the imaging characteristic of the relay optical system 61 falls within an allowable range, the reflection characteristics of the mirror 57 and beam splitter 56 may be different.

The beam splitter 56 has a reflectance characteristic as shown in FIG. 7. Most of light L4 from an illumination optical system 20 passes through the beam splitter 56, part of it is reflected by a mold 5 or substrate 8, and then most of it passes again through the beam splitter 56 (that is, returns to the illumination optical system 20). However, part of the light L4 is reflected by the beam splitter 56 and reaches the TTM detection system 17 (a sensor 46). If part of the light L4 from the illumination optical system 20 reaches the TTM detection system 17, it becomes noise of light detected by the sensor 46, decreasing the alignment accuracy.

In the embodiment, as in the seventh embodiment, by interposing a wavelength selection unit 40 between the beam splitter 56 and the TTM detection system 17, the light L4 from the illumination optical system 20 can be prevented from reaching the TTM detection system 17 (sensor 46). In alignment, the sensor 46 can detect only the light L3 reflected by the alignment mark (that is, without containing noise generated by the light L4), so high-accuracy die-by-die alignment can be implemented. Also, degradation of the performance of optical members which are not durable to ultraviolet light, that is, optical members inserted in an optical path extending from the beam splitter 56 to the sensor 46 can be prevented. Thus, high-accuracy die-by-die alignment can be maintained for a long period.

Figure 14:
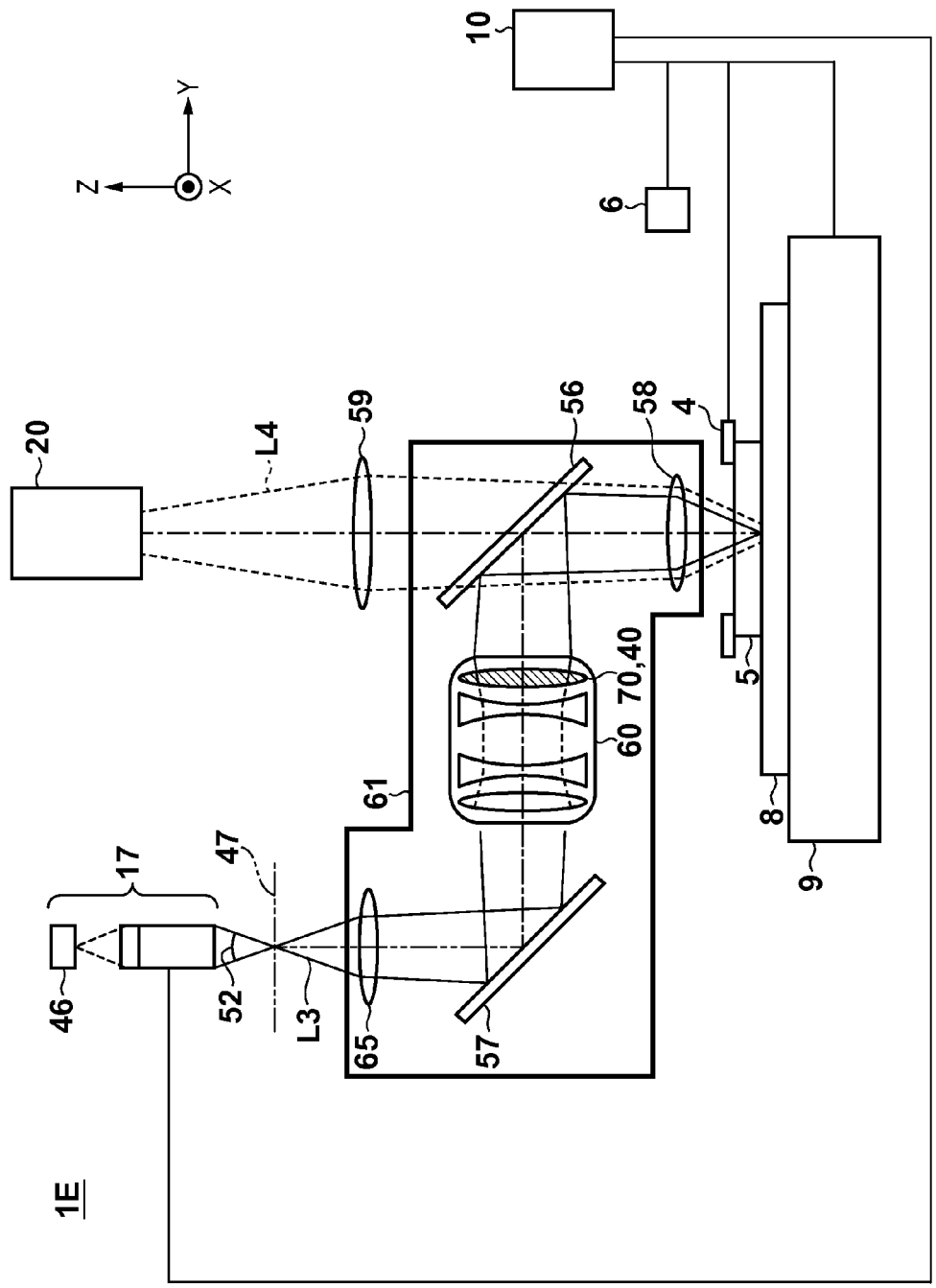
FIG. 14 is a schematic view showing the arrangement of the imprint apparatus in the eighth embodiment of the present invention.

Part of the optical system 60 may have the function of the wavelength selection unit 40. For example, as shown in FIG. 14, a lens 70 (lens closest to the beam splitter 56) constituting the optical system 60 may have the function of the wavelength selection unit 40.

Ninth Embodiment

As described above, the imprint apparatus according to each embodiment can implement high-accuracy die-by-die alignment, accurately overlay an underlying pattern and mold pattern, and thus increase the device yield. Hence, the imprint apparatus according to each embodiment can provide a low-cost, high-quality article such as a semiconductor device. A method of manufacturing a device (for example, a semiconductor device, magnetic storage medium, or liquid crystal display element) as an article will be explained. The manufacturing method includes a step of transferring (forming) a pattern on a substrate (for example, a wafer, glass plate, or film substrate) using the imprint apparatus according to each embodiment. The manufacturing method further includes a step of etching the substrate on which the pattern has been transferred. When manufacturing another article such as a pattern dot medium (recording medium) or optical element, the manufacturing method includes, instead of the etching step, another processing step of processing a substrate on which the pattern has been transferred.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-145841 filed on Jul. 11, 2013, which is hereby incorporated by reference herein in its entirety.

What is claimed is:

1. An imprint apparatus for forming a pattern on an imprint material on a substrate by using a mold, the imprint apparatus comprising:
    an illumination optical system configured to irradiate the imprint material with first light for curing the imprint material;
    a detection optical system configured to irradiate, with second light, a mark on the mold and a mark on the substrate, and guide the second light reflected by the marks to a sensor;
    a relay optical system configured to form an imaging plane of the substrate plane between the detection optical system and the relay optical system,
    wherein the relay optical system comprises:
        a light combining device configured to combine the first light from the illumination optical system and the second light from the detection optical system and guide the combined first light and second light to the mold;
        an optical member configured to transmit the second light from the light combining device so that the second light becomes incident on the sensor, and block the first light from the light combining device;
        a light-transmissive member arranged in an opposite side of the optical member with respect to a center of the relay optical system; and
        lenses arranged point-symmetric with respect to the center of the relay optical system.

2. The apparatus according to claim 1, wherein the optical member and the light-transmissive member each are composed of a plate member.

3. The apparatus according to claim 1, wherein:
    the optical member is arranged nearer to the light combining device with respect to the center of the relay optical system than the light-transmissive member, and
    the light-transmissive member is arranged nearer to the detection optical system with respect to the center of the relay optical system than the optical member.

4. The apparatus according to claim 1, wherein:
the relay optical system further includes a convex lens and a concave lens, and
the convex lens and the concave lens are arranged point-symmetric with respect to the center of the relay optical system.

5. The apparatus according to claim 4, wherein the convex lens and the concave lens are an optical system for correcting chromatic aberration.

6. The apparatus according to claim 1, wherein:
the light combining device reflects second light toward the optical member, and
the relay optical system further includes a light-reflection member arranged in an opposite side to the light combining device with respect to the center of the relay optical system.

7. The apparatus according to claim 6, wherein the light combining device and the light-reflection member are arranged point-symmetric with respect to the center of the relay optical system.

8. The apparatus according to claim 1, wherein the relay optical system further includes optical members arranged point-symmetric with respect to the center of the relay optical system.

9. The apparatus according to claim 1, wherein:
the first light and the second light have different wavelengths, and
the optical member is a wavelength selection unit where a light transmittance of a wavelength of the first light is smaller than a light transmittance of a wavelength of the second light.

10. The apparatus according to claim 1, wherein:
the first light and the second light have different wavelengths, and
the light combining device comprises a dichroic mirror.

11. The apparatus according to claim 1, wherein:
the first light includes light in an ultraviolet band, and
the second light includes light in a visible band or an infrared band.

12. The apparatus according to claim 1, further comprising:
a control unit;
wherein the sensor detects an image formed by light from the mark formed on the mold and the mark formed on the substrate, and
wherein the control unit is configured to control a relative position of the mold and the substrate based on the image detected by the sensor.

13. The apparatus according to claim 1, wherein the optical member and the light-transmissive member are arranged point-symmetric with respect to the center of the relay optical system.

14. The apparatus according to claim 13, wherein the optical member and the light-transmissive member each are composed of a plate member having the same shape.

15. A method of manufacturing an article, the method comprising:
forming a pattern on a substrate using an imprint apparatus; and
manufacturing the article by processing the substrate on which the pattern has been formed,
wherein the imprint apparatus forms a pattern on an imprint material on the substrate using a mold, and includes:
an illumination optical system configured to irradiate the imprint material with first light for curing the imprint material;
a detection optical system configured to irradiate, with second light, a mark on the mold and a mark on the substrate, and guide the second light reflected by the marks to a sensor;
a relay optical system configured to form an imaging plane of the substrate plane between the detection optical system and the relay optical system,
wherein the relay optical system comprises:
a light combining device configured to combine the first light from the illumination optical system and the second light from the detection optical system and guide the combined first light and second light to the mold;
an optical member configured to transmit the second light from the light combining device so that the second light becomes incident on the sensor, and block the first light from the light combining device;
a light-transmissive member arranged in an opposite side of the optical member with respect to a center of the relay optical system; and
lenses arranged point-symmetric with respect to the center of the relay optical system.

* * * * *